United States Patent [19]

Dickey et al.

[11] Patent Number: 5,725,746
[45] Date of Patent: Mar. 10, 1998

[54] SHIELDING FOR ARC SUPPRESSION IN ROTATING MAGNETRON SPUTTERING SYSTEMS

[75] Inventors: Eric R. Dickey; Erik J. Bjornard, both of Northfield, Minn.

[73] Assignee: Viratec Thin Films, Inc., Faribault, Minn.

[21] Appl. No.: 408,022

[22] Filed: Mar. 21, 1995

Related U.S. Application Data

[63] Continuation of Ser. No. 158,729, Nov. 29, 1993, Pat. No. 5,470,452, which is a continuation of Ser. No. 16,492, Feb. 10, 1993, abandoned, which is a continuation of Ser. No. 823,026, Jan. 15, 1992, abandoned, which is a continuation of Ser. No. 565,921, Aug. 10, 1990, abandoned.

[51] Int. Cl.$^6$ ............................................. C23C 14/34
[52] U.S. Cl. ........................ 204/298.21; 204/298.28; 204/298.11
[58] Field of Search ..................... 204/298.11, 298.12, 204/298.16, 298.19, 298.21, 298.23, 298.28

[56] References Cited

U.S. PATENT DOCUMENTS

| | | |
|---|---|---|
| 3,897,325 | 7/1975 | Aoshima et al. . |
| 4,116,794 | 9/1978 | Penfold et al. . |
| 4,166,018 | 8/1979 | Chapin . |
| 4,221,652 | 9/1980 | Kuriyama . |
| 4,356,073 | 10/1982 | McKelvey . |
| 4,362,611 | 12/1982 | Logan . |
| 4,422,916 | 12/1983 | McKelvey . |
| 4,443,318 | 4/1984 | McKelvey . |
| 4,445,997 | 5/1984 | McKelvey . |
| 4,466,877 | 8/1984 | McKelvey . |
| 4,485,000 | 11/1984 | Kawaguchi et al. . |
| 4,486,289 | 12/1984 | Parsons . |
| 4,519,985 | 5/1985 | Innis . |
| 4,545,882 | 10/1985 | McKelvey . |
| 4,619,755 | 10/1986 | Hessberger et al. . |
| 4,668,358 | 5/1987 | Rille et al. . |
| 4,818,358 | 4/1989 | Hubert et al. . |
| 4,904,362 | 2/1990 | Gaertner et al. . |
| 5,047,131 | 9/1991 | Wolfe et al. . |

FOREIGN PATENT DOCUMENTS

| | | |
|---|---|---|
| 32 29 969 A1 | 4/1983 | Germany . |
| 55-12732 | 1/1980 | Japan . |
| 01-215975 | 8/1989 | Japan . |

OTHER PUBLICATIONS

Hosokawa, et al., "Self–Sputtering Phenomena in High––Rate Coaxial Cylindrical Magnetron Sputtering", J. Vac. Sci. Technol., vol. 14, No. 1, Jan./Feb. pp. 143–146 (1977).

Hoffmann, "DC Reactive Sputtering Using Rotating Cylindrical Magnetron", Proc. 32nd Annual Conf. Soc. Vac. Coaters, pp. 297–300 (1989).

Wright, et al., "Design Advances and Applications of the Rotatable Cylindrical Magnetron", J. Vac. Sci. Technol. vol. 4, No. 3, Part 1, pp. 388–392 (1986).

Wright, "Recent Advances in the Design and Application of the Rotable Cylindrical Magnetron", Annual Technical Conference, Soc. Vac. Coaters, pp. 443–465 (1986).

Aronson, et al., "Inline Production Magnetron Sputtering," Vacuum, vol. 27, No. 3, pp. 151–153 (1977).

*Primary Examiner*—Nam Nguyen
*Attorney, Agent, or Firm*—Fish & Richardson P.C.

[57] ABSTRACT

A cathode body for a rotating cylindrical magnetron wherein the magnetron provides a sputtering zone extending along the length of the cathode body and circumferentially along a relatively narrow region thereof. The cathode body includes an elongated tubular member having a target material at the outer surface thereof. A collar of electrically-conductive material is located at at least one end of the tubular member, and extends along the tubular member from that one end into the erosion zone. A sleeve of electrically-conductive material may extend circumferentially around the collar.

3 Claims, 4 Drawing Sheets

SHIELDING FOR ARC SUPPRESSION IN ROTATING MAGNETRON SPUTTERING SYSTEMS

This is a continuation of application Ser. No. 08/158,729, filed Nov. 29, 1993 now U.S. Pat. No. 5,470,452, which is a continuation of application Ser. No. 08/016,492, filed Feb. 10, 1993, now abandoned, which is a continuation of application Ser. No. 07/823,026, filed Jan. 15, 1992, now abandoned, which is a continuation of application Ser. No. 07/565,921, filed Aug. 10, 1990 now abandoned.

BACKGROUND OF THE INVENTION

The present invention relates generally to sputtering systems, and more particularly to sputtering insulating materials in a rotating cylindrical magnetron using a DC reactive sputtering method.

DC reactive sputtering is the process most often used for large area commercial coating applications, such as the application of thermal control coatings to architectural and automobile glazings. In this process, the articles to be coated are passed through a series of in-line vacuum chambers isolated from one another by vacuum locks. This may be referred to as a continuous in-line system or simply a glass coater.

Inside the chambers, a sputtering gas discharge is maintained at a partial vacuum at a pressure of about three millitorr. The sputtering gas comprises a mixture of an inert gas, such as argon, with a small proportion of a reactive gas, such as oxygen, for the formation of oxides.

Each chamber contains one or more cathodes held at a negative potential of about −200 to −1000 volts. The cathodes may be in the form of elongated rectangles, the length of which spans the width of the line of chambers. The cathodes are typically 0.10 to 0.30 meters wide and a meter or greater in length. A layer of material to be sputtered is applied to the surface of the cathodes. This surface layer or material is known as the target or the target material. The reactive gas forms the appropriate compound with the target material.

Ions from the sputtering gas discharge are accelerated into the target and dislodge, or sputter off, atoms of the target material. These atoms, in turn, are deposited on a substrate, such as a glass sheet, passing beneath the target. The atoms react on the substrate with the reactive gas in the discharge to form a thin film.

The architectural glass coating process was made commercially feasible by the development of the magnetically-enhanced, planar magnetron. This magnetron has an array of magnets arranged in the form of a closed loop and mounted in a fixed position behind the target. A magnetic field in the form of a closed loop is thus formed in front of the target plate. The field causes electrons from the discharge to be trapped in the field and travel in a spiral pattern, which creates a more intense ionization and higher sputtering rates. Appropriate water cooling is provided to prevent overheating of the target. The planar magnetron is further described in U.S. Pat. No. 4,166,018.

A disadvantage of the planar magnetron is that the target material is only sputtered in the narrow zone defined by the magnetic field. This creates a "racetrack"-shaped sputtering zone on the target. Thus, a "racetrack"-shaped erosion zone is produced as sputtering occurs. This causes a number of problems. For example, (1) localized high temperature build-up eventually limits the power at which the cathodes can operate, and (2) only about 25 percent of the target material is actually used before the target must be replaced. Another significant problem, affecting uniformity and stability, is the build-up of oxides on the target outside of the erosion zone. This leads to arc discharges which temporarily perturb the gas discharge conditions. The arcing problem is very severe when silicon dioxide is being deposited by reactive sputtering of silicon.

The rotary or rotating cylindrical magnetron was developed to overcome some of the problems inherent in the planar magnetron. The rotating magnetron uses a cylindrical cathode and target. The cathode and target are rotated continually over a magnetic array which defines the sputtering zone. As such, a new portion of the target is continually presented to the sputtering zone which eases the cooling problem, allowing higher operating powers. While this cooling is more effective it is still possible for rotating magnetron cathodes to reach a temperature sufficient to melt low melting point target materials such as tin, lead, or bismuth, particularly at the ends of the sputtering zone. It is at the ends where the power density is highest because of the "turn around" portion of the "racetrack".

The rotation of the cathode and target also ensures that the erosion zone comprises the entire circumference of the cylinder covered by the sputtering zone. This increases target utilization and reduces arcing from the target within the erosion zone. The rotating magnetron is described further in U.S. Pat. Nos. 4,356,073 and 4,422,916, the entire disclosures of which are hereby incorporated by reference.

The rotating magnetrons while solving some problems produced others. These problems include new arcing phenomena, which are particularly troublesome in the DC reactive sputtering of silicon dioxide and similar materials such as aluminum oxide and zirconium oxide. Insulating materials like silicon dioxide are particularly useful to form high quality, precision optical coatings such as multilayer, antireflection coatings and multilayer, enhanced aluminum reflectors. Such coatings would be much more economical to produce if they could be applied by an in-line, DC reactive sputtering process.

The true advantages of a continuous, in-line sputtering process, as far as operating efficiencies are concerned, are only realized if the process can be continuously operated to produce acceptable product. Perturbation of the sputtering conditions due to arcing is especially detrimental to cost effective operation, as any article being coated when an arc occurs will most likely be defective. For instance, the article may be contaminated by debris resulting from the arc, or it may have an area with incorrect film thickness caused by temporary disruption of the discharge conditions. Furthermore, the occurrence of arcs increases with operating time, and eventually reaches a level which requires that the system be shut down for cleaning and maintenance.

By way of example, in one rotating magnetron configuration, arcing from cathode ends and bearing structures while depositing silicon dioxide from a silicon target was experienced less than one hour after sputtering commenced. The occurrence of arcs increased rapidly with operating time, reaching a frequency of about one hundred arcs per minute in less than 2 hours. This caused permanent perturbation of the discharge conditions, requiring that the machine be shut down for maintenance. This rotating magnetron configuration is described in J. Hoffman, "DC Reactive Sputtering Using a Rotating Cylindrical Magnetron", Proceedings of the 32nd Annual Conference of the Society of Vacuum Coaters, pp. 297—300 (1989).

In view of the foregoing, an object of the present invention is to improve the effectiveness of the DC reactive sputtering process for silicon dioxide and other materials, which are highly insulating, when deposited by DC reactive sputtering.

Another object of the present invention is to substantially reduce or eliminate the occurrence of arcs in rotating cylindrical magnetrons.

A further object of the invention is to increase the deposition rate for low melting point target materials.

Additional objects and advantages of the invention will be set forth in the description which follows, and in part will be obvious from the description or will be learned from practice of the invention. The objects and advantages of the invention may be realized and obtained by means of the instrumentalities and combinations particularly pointed out in the claims.

SUMMARY OF THE INVENTION

The present invention is directed to a cathode body for a rotating cylindrical magnetron wherein the magnetron provides a sputtering zone extending along the length of the cathode body and circumferentially along a relatively narrow region thereof. The cathode body includes an elongated tubular member having a target material at the outer surface thereof. Means exist at at least one end of the tubular member for suppressing arcing.

The primary means of suppressing arcing comprises a cylindrical region on each end of the cathode body which has a surface of a collar material different from the target material. The cylindrical region extends into the sputtering zone typically for a distance of about two inches. The collar material is sputtered as the target material is sputtered, but typically at a lower rate. The sputtered collar material forms films having poor insulating properties. These films deposit on the cathode ends, dark space shielding and support structures in preference to the material sputtered from the target. Electrical leakage through these poorly-insulating films significantly reduces charge build-up and arcing.

The rotating cylindrical magnetron may be disposed in evacuable coating chamber, and means may be provided for transporting an article past the sputtering zone to receive the sputtered material.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DETAILED DESCRIPTION OF THE PREFERRED EMBODIMENTS

Figure 1:
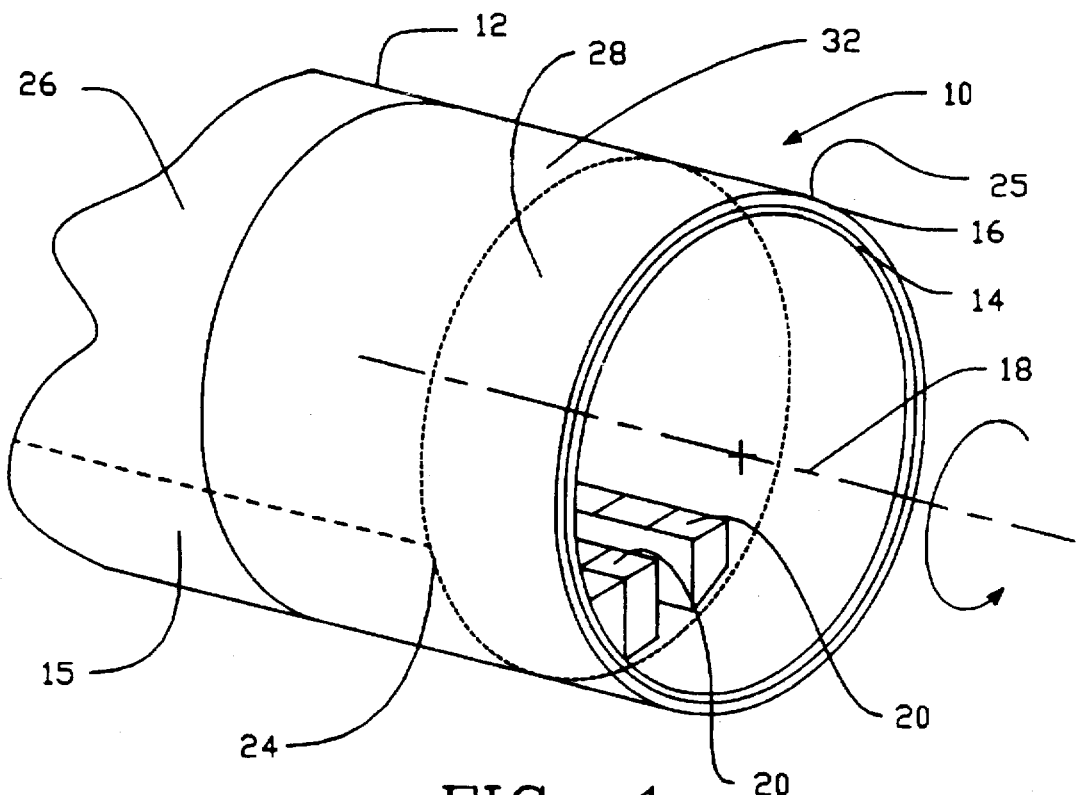
FIG. 1 is a schematic view of a rotary cylindrical magnetron showing the sputtering zone and the erosion zone in relation to the magnetic array.

The present invention will be described in terms of a number of different embodiments. Referring in detail to the drawings, wherein like reference numerals designate like parts in several figures, and initially to FIG. 1, the principles of the present invention are illustrated.

As shown in FIG. 1, a rotating or rotary cylindrical magnetron 10 comprises a cathode body 12 including a tube or tubular member 14 with a target material 16 at the tube's outer surface. As is known, a magnetic array or bars 20 extend within the cathode body along a portion of the length thereof. The cathode body 12 rotates about an axis 18 while magnetic array 20 remains stationary.

Normally, magnetic array 20 does not extend completely to the respective ends of cathode body 12. This is because the seals, cooling water conduits, and bearing members are attached at one end of the cathode body. As a result, the magnetron's sputtering zone 15 does not extend all the way to the ends of the cathode body.

As shown in FIG. 1, sputtering zone 15 extends as far as circumferential line 24, roughly corresponding with the end of magnetic array 20. The rotation of the cathode body produces a uniform erosion zone 26 which extends around the circumference of cathode body 12. This leaves an unsputtered area 28 outside the erosion zone and beyond circumferential line 24. Area 28 thus extends from circumferential line 24 to the end 25 of cathode body 12. A similar unsputtered area (not shown) exists at the opposite end of the cathode body. Thus, the cathode body ends are not sputtered. As such, an oxide film is built up at the ends which, sooner or later, depending on the material being sputtered, will produce arcing from these unsputtered areas of the cathode body.

By way of example, a cathode body may be about 54 inches long and about 6 inches in diameter. The magnetic array can have a length of about 51 inches. As such, the sputtering and erosion zones would then have a length of approximately 52 inches. The unsputtered zone then extends about 1 inch along the cathode body at each end thereof.

Some materials, such as titanium oxide, zinc oxide, and indium tin oxide, when reactively sputtered form crystalline films having poor dielectric properties or even semiconductive properties. When these films accumulate on the unsputtered areas of the cathode, charges can easily leak through them. This prevents a charge build-up which may otherwise produce arcing. Only when such films are relatively thick, on the order of several microns, will arcing be a problem. This, however, may not occur until after several hours of operation.

Silicon dioxide films, reactively sputtered from silicon, however, deposit in a substantially amorphous form and are excellent electrical insulators. Reactively sputtered films of aluminum oxide and zirconium oxide have similar properties. When such insulating films form on the unsputtered areas of the cathode, for example beyond circumferential line 24, positive charges can build-up rapidly. Thus, an arc may be produced when the insulating film breaks down under the high electrical field produced by the charge accumulation across the film. The better the insulating properties, the more rapidly will arcing occur, generally within an hour of operation.

As shown in FIG. 1, the present invention, in its simplest form, includes a collar 32. The collar 32 is in contact with cathode body 12, and extends beyond circumferential line 34 into erosion zone 26. Preferably, and by way of example, when sputtering silicon, the collar extends approximately two inches into the erosion zone. Such a collar is formed at each end of the collar body.

The collar material should have a high melting point. A high melting point reduces the chance of damage to the collar when an arc does occur. Damage on the collar would provide sites which might initiate further arcing.

The collar material should form a compound with the reactive component of the sputtering gas. For example, the compound may be an oxide or a nitride of the collar material. Such compounds form films having poor insulating properties. Charge leakage should occur through these films even if tens of microns thick.

The collar material should have a lower sputtering rate than the target material. Material sputtered from the collar material will be deposited not only on the cathode ends and support structures, but also on the edges of a substrate being coated where it will be mixed with material sputtered from the target. It is desirable to keep the ratio of sputtered collar material to sputtered target material on the substrate edges as low as possible. The sputtering rate of the collar material can not, however, be zero. Otherwise, sputtered target material would eventually deposit on the support structures and cause arcing. Sputtering from the collar does not prevent material sputtered from the target from reaching these support structures. Rather, it ensures that the sputtered target material is mixed with the sputtered collar material which destroys the insulating properties of the sputtered target material.

Any collar material will be useful to some degree provided that when sputtered it has a lesser tendency to arc than the sputtered target material under the same conditions. Suitable collar materials include scandium, titanium, vanadium, chromium, manganese, iron, cobalt, nickel, zirconium, molybdenum, hafnium, tantalum, tungsten, rhodium, platinum, and iridium. It has been found that titanium is an ideal collar material when sputtering silicon dioxide from a silicon target.

A further benefit derived from a high melting point collar material is that the collar can be extended into the sputtering zone to cover the "turnaround" of the "racetrack" shaped sputtering zone where the power deposited on the cathode is highest. If the target material is a low melting point material, higher power can be applied to the cathode body before the melting point of the target material is reached. Higher deposition rates for low melting point materials are, therefore, achievable using such collars on the cathode body.

A number of options for applying collar 32 to the end of cathode body 12 are available. More specifically, it is not necessary that the collar actually be a separate cylindrical unit attached to the cathode body.

Rather, the term collar as used in the context of the present invention means a cylindrical region around the ends of the cathode body wherein the collar material is different from the target material. For example, if tubular member 14 is made from a suitable collar material. A collar may be formed by removing the target material from the tubular member 14 such that an appropriate section or sections are left exposed to form a collar or collars. If tubular member 14 is made from the target material, an additional layer of material would have to be applied to the target material to form the collar.

There is no specific formula for determining the extent to which the collar extends into the sputtering zone. The further the extension than the less will be the possibility that material sputtered from the target will reach the cathode body ends and the support structures. The further the extension, however, the narrower will be the target region and thus the narrower the substrate which can be coated with sputtered target material. The collar and target materials involved will also influence the determination. An extension of 2 inches for titanium collars used with silicon represents a value that was experimentally determined, and which can be used as a guideline when dealing with other materials.

In certain mounting configurations for a cylindrical magnetron, it is helpful to enclose the ends of the cathode body with a dark space shield. This reduces arcing. Such shields are discussed below. It has been found, however, that without the addition of the collars to the cathode body, the dark space shields rapidly become contaminated with coating material and become arc sources.

The collar, therefore, appears to be the most effective measure in reducing arcing. In combination with dark space shielding over the cathode body ends, the collars have been found to substantially eliminate arcing during the reactive sputtering of silicon dioxide.

For example, a dark shield or sleeve may be concentrically disposed about cathode body 12 and spaced from its surface. The shield may extend from end 25 of the cathode body a distance approximately equal to the dark space length (discussed below) and may extend to the edge of the sputtering zone, up to or just past circumferential line 24. The shield would thus encircle the end of the cathode body and the corresponding portion of collar 32.

The shield is spaced from collar 32 to form a gap. The distance across this gap is less than the dark space length. The dark space is the region of gas discharge next to the cathode. Here, the electrons accelerate under an applied operating voltage to become adequately energized to cause ionization of the sputtering gas. The dark space length is a function of the type of sputtering gas, the gas pressure and the applied electric field. The dark space length may be on the order of three millimeters.

The dark space shield protects the cathode body from the gas discharge and resultant ion bombardment. The shield around the end of the cathode body may prevent the sputtering gas discharge from contacting that end. The shield has a provision, such as a flange, for attachment to an appropriate support member, as will be described below. The shield is also insulated from this mounting surface so that it is electrically-isolated therefrom. Thus, it floats electrically and acquires an electrical potential of the gas discharge. A preferred material for the shield is stainless steel.

Figure 2:
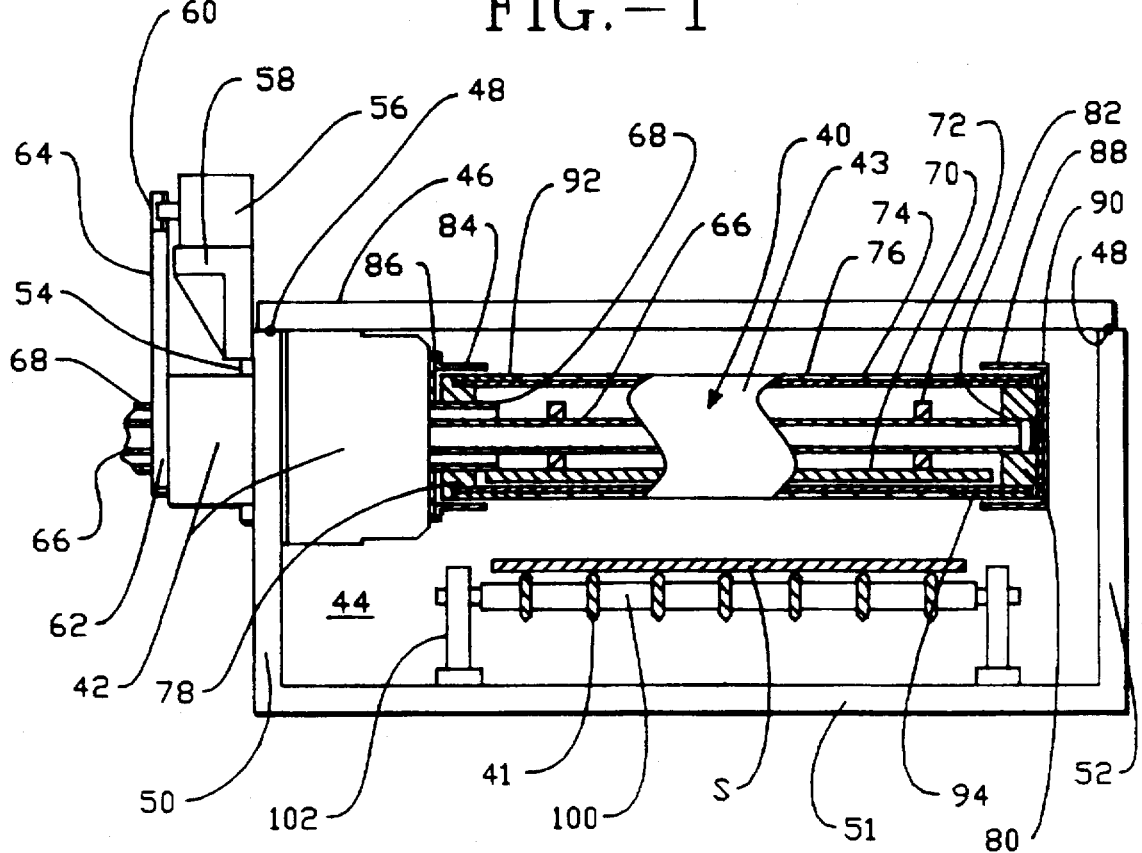
FIG. 2 is a schematic longitudinal section through a coating chamber showing a rotary cylindrical magnetron cathode constructed in accordance with the principles of the present invention wherein the magnetron is supported at one end only.

As shown in FIG. 2, a rotating cylindrical magnetron 40 may be mounted in a cantilevered fashion within an evacuable coating chamber 44. As is known, the substrates S to be coated pass beneath cylindrical magnetron 40 on compound rollers 41. The substrates may be coated with a thin film of silicon dioxide or other material.

The cylindrical magnetron 40 includes a cathode body 43 mounted to a rotatable vacuum seal unit 42. As is known in the art, unit 42 provides an arrangement by which the cathode body may be rotated while maintaining a vacuum in coating chamber 44. The vacuum unit 42 also provides the necessary electrical, mechanical and fluid connections between magnetron 40 and the area outside the vacuum chamber. The vacuum unit 42 is disposed and sealed by a flange 54 in an opening in side wall 50 of chamber 44. The coating chamber is sealed by a top cover 46 having an appropriate vacuum seal 48. The top cover spans the distance between respective side walls 50 and 52 of chamber 44. As is known, magnetron 40 may be installed in and removed from chamber 44 through top cover 46.

The drive for rotating cathode body 43 is provided by an electric motor 56 mounted on a support bracket 58. The drive is transmitted to the cathode body by pulleys 60 and 62, and a drive belt 64.

Cooling water is fed into the cathode body through a stationary tube or conduit 66. As shown, tube 66 extends from coating chamber 44 to a location external thereof by means of vacuum seal unit 42. The tube 66 also supports magnetic array 70 which is attached to the tube by appropriate brackets 72. The cooling water is removed via a tube or conduit 68 which also passes through vacuum seal unit 42. Tube 68 also carries the necessary electrical connections for magnetron 40.

As is known, the end of the cathode body adjacent vacuum unit 42 is sealed by a sealing plug 78. The cooling water tubes 66 and 68 extend through this plug. A sealing plug 80 is located at the opposite end of the cathode body. It is recessed to provide a bearing 82 about which the cathode body rotates.

As noted, substrates S are transported past cylindrical magnetron 40 on compound rollers 41. The rollers are mounted on a shaft 100 which rotates in bearings 102. The bearings, in turn, are mounted on the floor or base plate 51 of the coating chamber. A series of such roller shafts separated from each other by a distance of about one foot may extend along the length of coating chamber 44 in the direction of transport of the substrates. They are rotated by a chain drive system, which is not shown.

As previously discussed, cathode body 43 comprises a tubular member 74 having a target material 76 at the outer surface thereof. The tubular member may be formed of the target material, or a target material may be sprayed-coated onto a tubular member comprised of a non-target material such as stainless steel.

Figure 3:
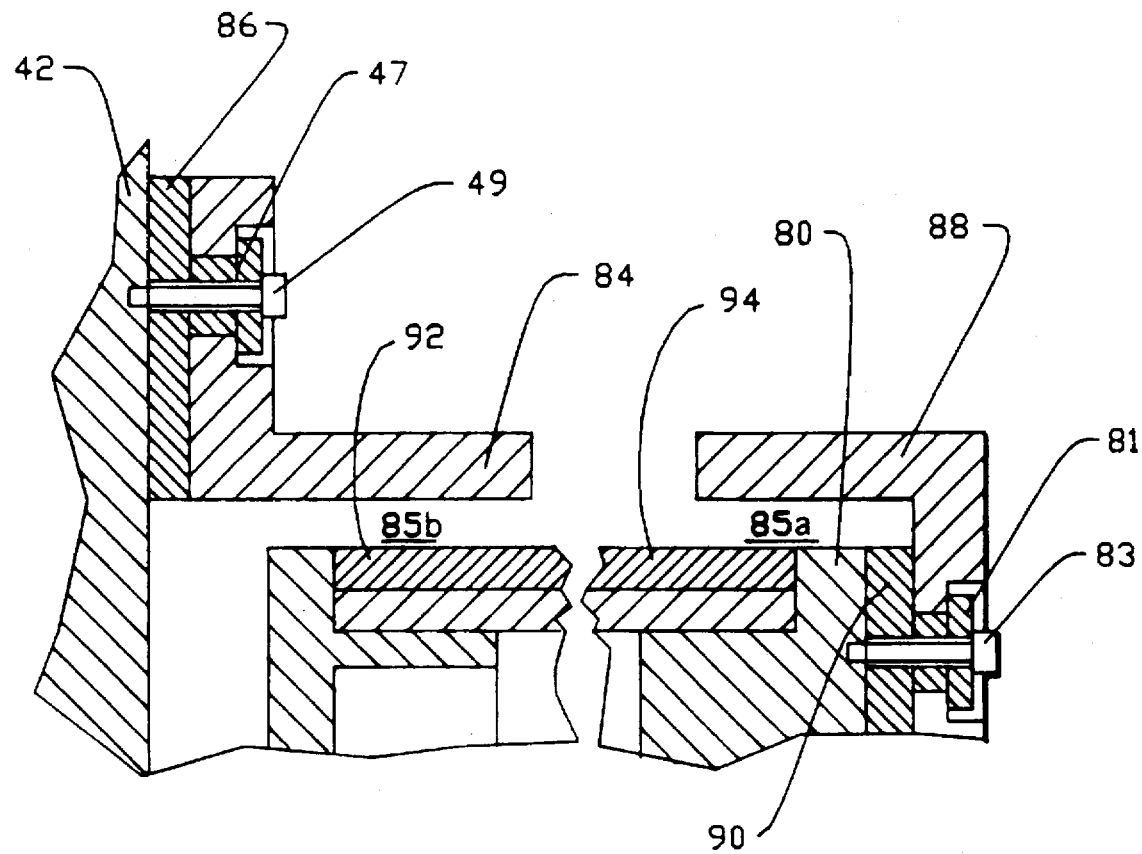
FIG. 3 is an enlarged schematic cross-section showing mounting of the shields.
Figure 3:
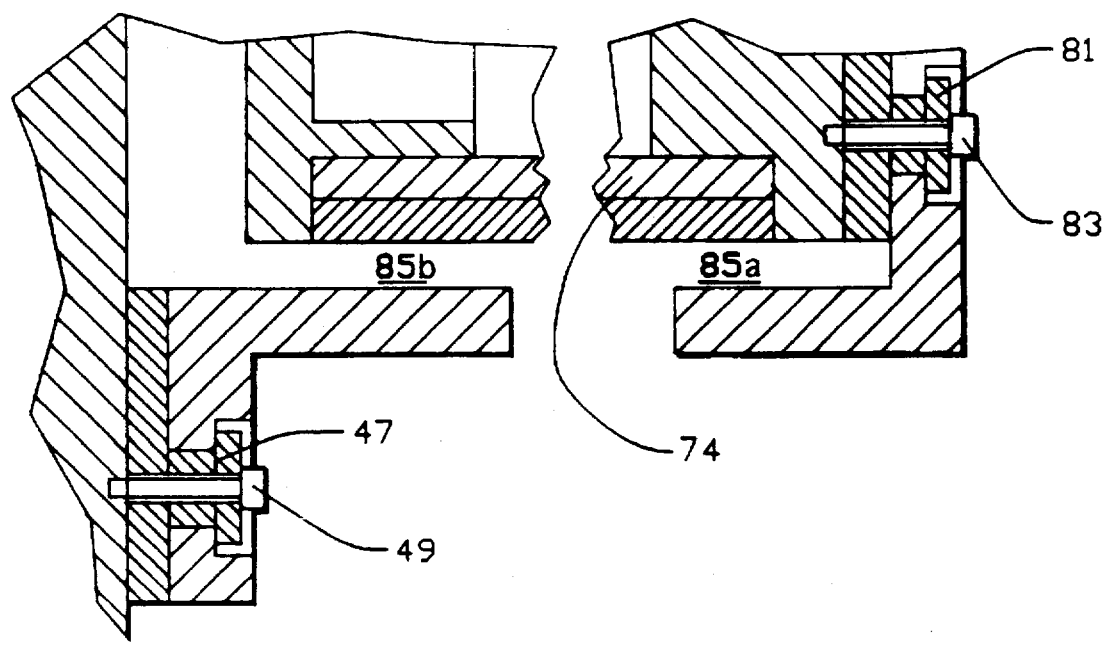

In this embodiment, collars 92 and 94 are formed at each end of cathode body 43 (see also FIG. 3). As discussed, the collars extend from the respective ends of the cathode body into the erosion zone. Preferably, each collar 92, 94 extends into the erosion zone by a distance of approximately two inches for silicon sputtering.

Dark space shields or sleeves 84 and 88 are concentrically disposed about collars 92 and 94, respectively, at each end of cathode body 43. The sleeves extend along the cathode body for at least one dark space length. The dark space length is the distance that an electron must travel under the applied cathode potential and gas pressure before it acquires enough energy to initiate ionization of the gas. For a voltage of about 500 volts and a sputtering pressure of about 3 millitorr, the dark space length is about 3 mm.

As shown more clearly in FIG. 3, sleeve 84 is mounted to the face of vacuum seal unit 42 by means of insulated bushings 47 and screw 49. An electrical insulator 86, such as nylon, is disposed between the sleeve and the surface of the vacuum unit. Thus, the sleeve is electrically isolated from the vacuum unit.

At the other end of the cathode body, sleeve 88 is attached to the end plug 80 by means of insulating bushings 81 and screw 83 An electrical insulator 90, such as nylon, is disposed between the plug 80 and sleeve 88 at the point at which the sleeve is attached to the plug 80 to electrically isolate the sleeve from the member.

Also, as previously discussed, gaps 83, 85 are formed between sleeves 84, 88 and collars 92, 94, respectively. The distance across these gaps is less than the dark space length. As such, contact between the sputtering gas discharge and the unsputtered zone on the cathode body is reduced.

For certain applications, the shield and collar arrangement may be located at only one end of the cathode body. Also, in some applications, the sleeves need not be electrically insulated from their mounting surface. In certain mounting configurations, the dark space shields or sleeves may be unnecessary.

Figure 4:
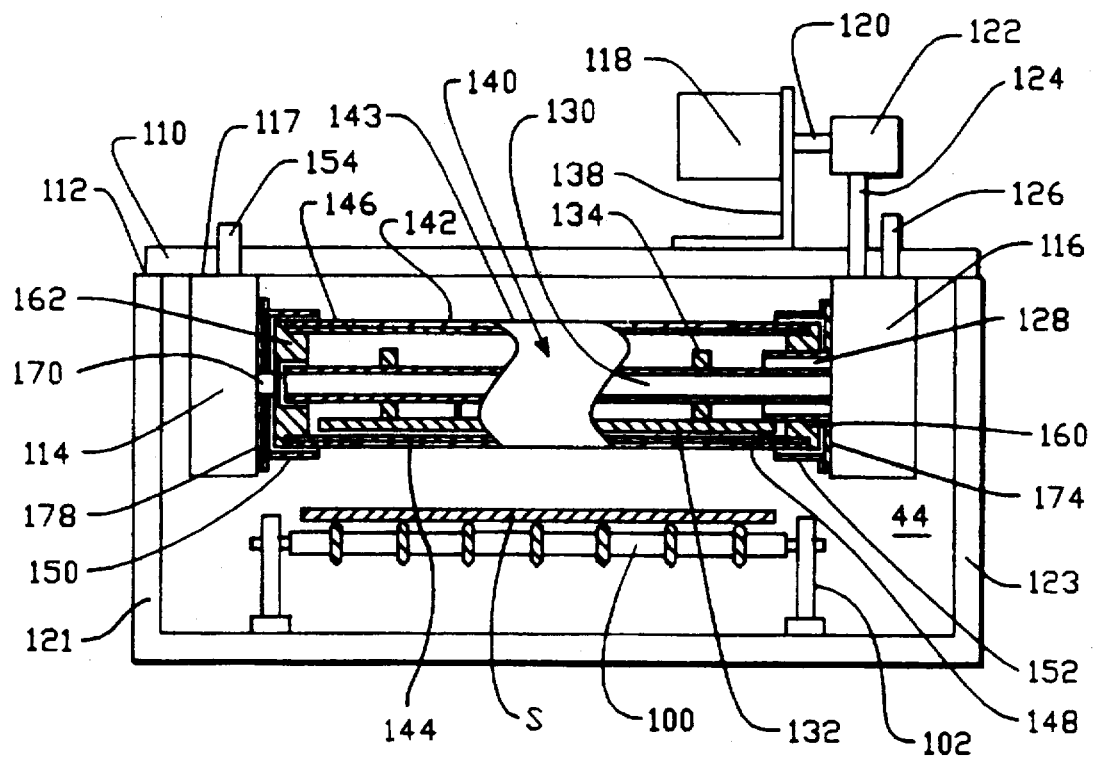
FIG. 4 is a view similar to FIG. 2 with the magnetron supported at both ends.

Another embodiment of the present invention is shown in FIG. 4. Here, cathode body 143 of rotating magnetron 140 is mounted to end blocks 114 and 116 in coating chamber 120. The end blocks house the bearings, electrical and water connections for magnetron 140. As is known, end blocks 114 and 116 are mounted at top wall or cover 110 of chamber 120 by means of appropriate vacuum seals 117. The top wall 110 is sealed to side walls 121 and 123 of the chamber by vacuum seals 112.

The cathode body 143 is driven by an electrical motor 118 mounted at chamber top wall 110 by a support bracket 138. The motor drive is transmitted by a shaft 120 to a gearbox 122. A shaft 124 extends from the gear box into the end block 116 where it is mechanically linked to cooling water tube or conduit 128. Tube 128 is the output tube for the cooling water. The cooling water input tube 130 serves as the support for the magnetic bar or array 132. This tube also extends from end block 116. The magnetic bar 132 is mounted to tube 130 by a bracket arrangement 134. Fluid connections 126 are also provided on end block 116 to introduce water into tube 130 and to flow water from tube 128 by means of seals (not shown) inside block 116. A connection 154 at end block 114 is also provided to introduce electrical power to the magnetron. This is done through a brush contact within block 114 by way of a drive spindle 170.

The cathode body 143 comprises tubular member 144 having a target material 142 at the outer surface thereof. The cathode body is sealed by plugs 160 and 162 at the respective ends thereof. Plug 160 is penetrated by tube 128, and plug 162, which has a bearing 178 for tube 130, is attached to drive spindle 170.

Collars 146 and 148 are located at each end of the cathode body. A sleeve 150 is attached to end block 114 and isolated from it by electrical insulator 172. A sleeve 152 is also attached to end block 116 and insulated from it by insulator 174.

As discussed in reference to the above embodiments, sleeves 150 and 152 extend along the length of the tubular member for at least one dark space length. The collars 146 and 148 extend into the erosion zone. Respective gaps 155 and 157 are formed between collars 146, 148 and sleeves 150, 152. The distance across each gap is less than the dark space length. The mounting arrangement for these collars and sleeves is like that shown at the drive end of the magnetron of FIG. 3A.

Figure 5:
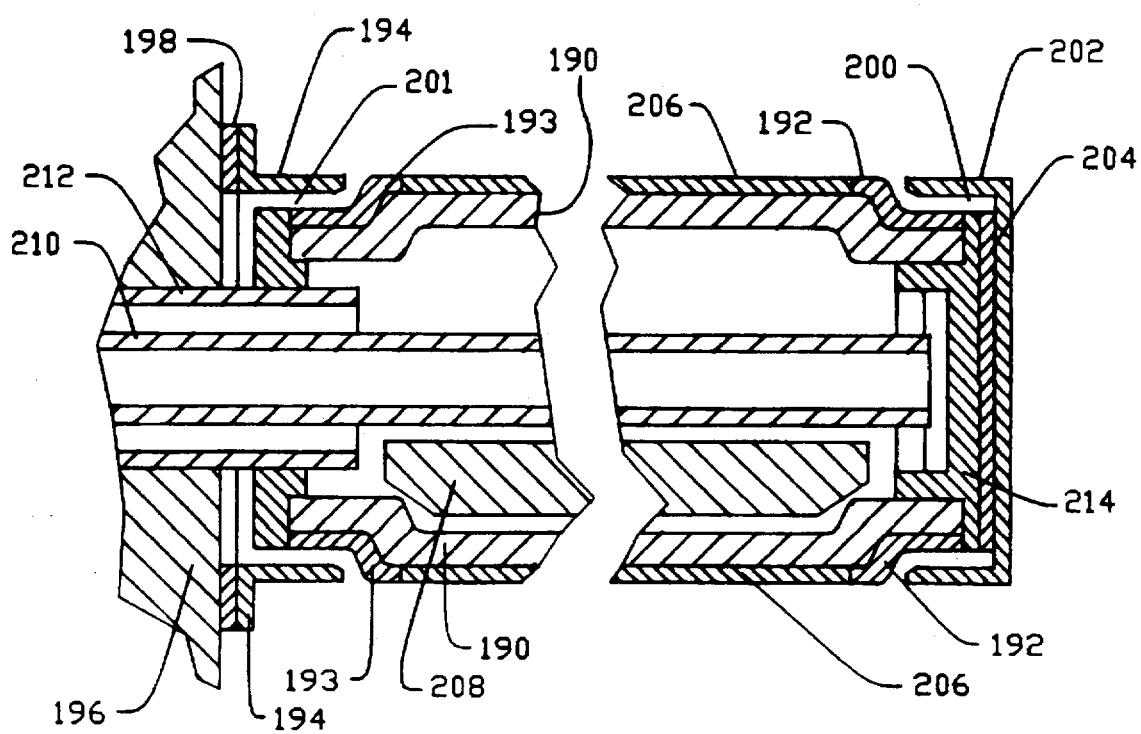
FIG. 5 is a schematic view of an embodiment of the present invention having a cathode body of reduced diameter at each end.

Another embodiment of the present invention is shown in FIG. 5. Here, cathode body 190 of rotating magnetron 195 is shown as mounted in a cantilevered fashion. The advantages offered by this embodiment, however, are equally applicable to a double-ended mounting configuration.

As shown, cathode body 190 has its diameter reduced at each end. Collars 192 and 193 at each end are shaped to conform to the contour of the cathode body. A sleeve 194 is mounted on a support member 196, such as the face of a vacuum sealing unit. The sleeve is electrically isolated from support member 196 by insulator 198. The sleeve's outside diameter is equal to or less than the larger outside diameter of the cathode body. The sleeve extends around collar 193.

At the free end of the cathode body, a sleeve 202 is mounted on sealing plug 214 and electrically isolated from the cathode body by insulator 204. Sleeve 202 is arranged around collar 192 in the same manner as sleeve 194. The magnetic array 208, and water cooling tubes 210 and 212 are also shown.

The gaps 200, 201 between the respective shields and collars is less than the cathode dark space length under normal sputtering conditions. In this embodiment, the entrances to gaps 200 and 201 are below the level of the cathode body. Thus, there is no line of sight contact between the gaps and target material 206 on the outer surface of the collars 192. As such, there is no direct access to gaps 200 and 201 for material sputtered from the target.

Figure 6:
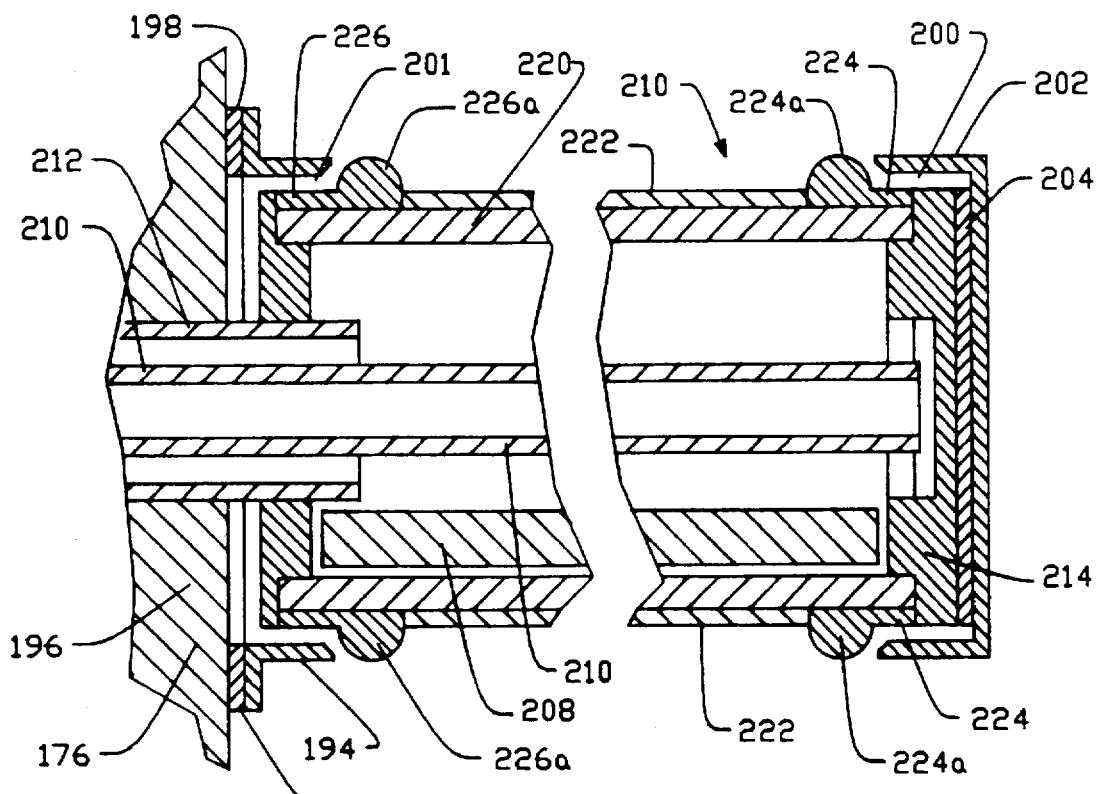
FIG. 6 is a schematic view of an embodiment of the present invention having collars with a raised portion to protect the sleeves from contamination by sputtered material.

Yet another embodiment of the present invention is shown in FIG. 6. Here, cathode body 210 comprises tubular member 220 with target material 222 at the outer surface thereof. Collars 224, 226 with raised beaded sections or portions 224a, 226a adjacent the target material are provided. The beads 224a, 226a are made high enough to prevent sputtered material from entering gaps 200, 201 between sleeves 194, 202 and collars 224, 226, respectively. The beads help to protect the shields from contamination.

It will be apparent to those skilled in the art that the concepts described in this embodiment can also be applied to a double-ended mounting configuration.

Figure 7:
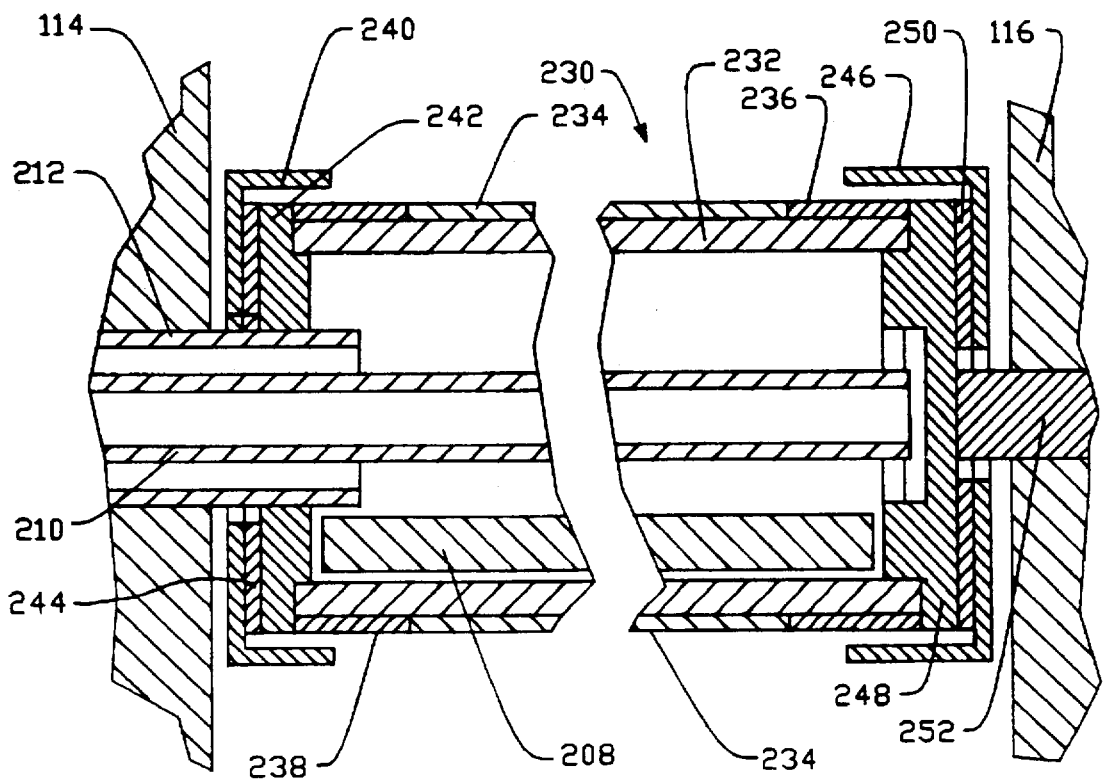
FIG. 7 is a schematic view of an embodiment of the present invention with a sleeve mounted on the cathode body at each end thereof.

Yet another embodiment of the invention is shown in FIG. 7. This embodiment provides an arc suppression system fully integrated into cathode body 230. The cathode body comprises tubular member 232 having target material 234 at the outer surface thereof. As previously described, collars 236, 238 are attached at opposite ends of the tubular member. A sleeve 240 is mounted on plug 242 by screws and electrically-isolated from the plug by an insulator 244. A second sleeve 246 is mounted on plug 272 and electrically-isolated by insulator 250 in the same way as shown at the free end of the magnetron of FIG. 3A. Clearance, typically less than the dark space length, is provided between the shield, and spindle 252 and a cathode support member. The cathode support members may be end blocks 116 and 114, as shown in FIG. 4. A drive spindle 252 extends from end block 116, and conduits 210 and 212 extend from end block 114.

The present invention has been described in terms of a number of embodiments. The invention, however, is not limited to the embodiments depicted and described. Rather, the scope of the invention is defined by the appended claims.

What is claimed is:

1. A rotating cylindrical magnetron sputtering apparatus for sputtering a thin film of a selected coating material on a substrate using a gas discharge, comprising:

an evacuable coating chamber;

a cathode including an elongated cylindrical tubular member having a layer of target material at the surface thereof and having a racetrack-shaped sputtering zone extending along the length of said tubular member with a turn around region at each end thereof, said turn around regions including a collar material having a sputtering rate less than that of said target material and a melting point higher than that of said target material, wherein a contiguous surface of said tubular member, extending over a majority of said sputtering zone, is substantially free of said collar material;

means for rotatably supporting said tubular member in said coating chamber; and means for transporting said substrate past said sputtering zone to receive the thin film, said thin film being substantially free of said collar material at least in an area between the edges of said substrate.

2. The apparatus of claim 1 wherein sputtered collar material forms another compound having electrical insulating properties less than that of said coating material.

3. A rotating cylindrical magnetron sputtering a first thin film of a selected material on a designated area of a substrate, comprising:

an elongated cylindrical tubular member having a layer of target material on a surface thereof and including a magnetic means for defining a sputtering zone extending along the length and circumferentially along a relatively narrow region of said tubular member;

and a collar of electrically conductive material different from said target material on at least one end of said tubular member, said collar extending circumferentially about said tubular member and along said tubular member inward from an edge of said sputtering zone, and said collar material having a sputtering rate less than that of said target material and a melting point greater than that of said target material, and sputtered collar material forming another compound having electrical insulating properties less than that of said coating material so as to reduce the insulating property of a second film deposited outside of said designated substrate area, wherein a contiguous surface of said tubular member, extending over a majority of said sputtering zone, is substantially free of said collar material, whereby said first thin film is substantially free of said collar material at least in an area between the edges of said substrate.

\* \* \* \* \*